US012351037B2

(12) United States Patent
David et al.

(10) Patent No.: US 12,351,037 B2
(45) Date of Patent: Jul. 8, 2025

(54) THERMAL MANAGEMENT OF ACTIVE DISCHARGE FUNCTION IN AUTOMOTIVE INVERTERS

(71) Applicant: Eaton Intelligent Power Limited, Dublin (IE)

(72) Inventors: James David, Portage, MI (US); Neeraj Sharma, Pune (IN); Amit Ravindra Chavan, Kolhapur (IN); Ravikiran Panjabrao Rathod, Sindkhed Raja (IN); Matthew Charles Haylock, Oregon City, OR (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 325 days.

(21) Appl. No.: 18/172,801

(22) Filed: Feb. 22, 2023

(65) Prior Publication Data

US 2024/0278648 A1 Aug. 22, 2024

(51) Int. Cl.
*H05K 7/20* (2006.01)
*B60L 3/00* (2019.01)
(Continued)

(52) U.S. Cl.
CPC ............ *B60L 15/007* (2013.01); *B60L 3/003* (2013.01); *H02M 7/483* (2013.01);
(Continued)

(58) Field of Classification Search
CPC ........ H02M 7/003; H02M 1/327; H02M 1/44; H05K 7/20927; H05K 7/1432;
(Continued)

(56) References Cited

U.S. PATENT DOCUMENTS 5,091,523 A * 2/1992 Talebian ................. A61P 35/00
536/17.3
6,166,937 A 12/2000 Yamamura et al.
(Continued)

FOREIGN PATENT DOCUMENTS

DE 102021207316 A1 1/2023
FR 3024420 A1 2/2016
JP 2015023720 A 2/2015

OTHER PUBLICATIONS

International Search Report and Written Opinion issued in International Application No. PCT/EP2024/025080, mailed Jun. 4, 2024, 12 pages.

*Primary Examiner* — Mandeep S Buttar
(74) *Attorney, Agent, or Firm* — Talem IP Law, LLP (57) ABSTRACT

A thermal management system for an automotive inverter includes an active discharge circuit in thermal communication with a DC link capacitor, a thermal interface material positioned between the active discharge circuit and the DC link capacitor such that heat generated from the active discharge circuit is transferred to the DC link capacitor, and a coolant channel for a cooling fluid extending between the DC link capacitor and a base plate of the automotive inverter, wherein the heat generated from the active discharge circuit of the automotive inverter is transferred from the DC link capacitor to dissipate the heat. A method to thermally manage heat dissipated from automotive inverter is also provided.

11 Claims, 7 Drawing Sheets

(51) Int. Cl.
*B60L 15/00* (2006.01)
*H02M 7/483* (2007.01)

(52) U.S. Cl.
CPC ...... *H05K 7/20927* (2013.01); *B60L 2210/42* (2013.01); *B60L 2240/525* (2013.01)

(58) Field of Classification Search
CPC .... H05K 7/2089; H05K 5/0247; H05K 7/209; H05K 5/04; H05K 7/20327; H05K 9/0081; H02K 5/203
USPC ........................................ 361/689, 702, 699
See application file for complete search history.

(56) References Cited

U.S. PATENT DOCUMENTS

| | | | |
|---|---|---|---|
| 8,040,088 B2 | 10/2011 | Katayama et al. | |
| 2019/0334440 A1* | 10/2019 | Miyazaki | H02M 3/1582 |
| 2020/0328026 A1* | 10/2020 | Nguyen | H01G 4/38 |
| 2023/0071172 A1* | 3/2023 | Fujiwara | H03H 7/0115 |
| 2024/0097577 A1* | 3/2024 | Brazeau | H02M 1/0009 |
| 2024/0154539 A1* | 5/2024 | Brazeau | H02M 1/126 |

\* cited by examiner

THERMAL MANAGEMENT OF ACTIVE DISCHARGE FUNCTION IN AUTOMOTIVE INVERTERS

BACKGROUND

Automotive inverters are used in electrical vehicle technology to convert DC power to AC power. The converted AC current can then power a traction drive motor in the electric vehicle, for example. Automotive inverters typically employ a relatively large energy storage capacitor as a main DC link to maintain a high voltage across a power bus, for example. The DC link capacitor is usually interfaced with a high voltage (HV) battery through a pair of mechanical contactors (e.g., relays). In the context of this application, a high voltage is defined as 600-1200 V DC.

The use of active discharge circuits is important in vehicle applications for safety reasons. For example, when a shutdown of the electric drive system of the vehicle system occurs, the mechanical contactors are opened causing the high voltage battery to be isolated from the rest of the electric system. However, a charge will still exist on the DC link capacitor which will need to be discharged as quickly as possible. The active discharge circuit accomplishes this functionality.

The active discharge circuit, however, takes up considerable space on the main printed circuit board (PCB) of the automotive inverter where space is limited. In addition, the active discharge circuitry produces a considerable amount of heat. Heat sinks have traditionally been used to dissipate the heat; however, heat sink components can increase the cost of the automotive inverter.

BRIEF SUMMARY

Embodiments that disclose a thermal management system for an automotive inverter are provided. Through certain embodiments of the proposed thermal management system, all of the electrical components of the active and passive discharge circuitry are accommodated in a packaging that dissipates heat generated from the electrical components without utilizing an external heat sink.

A thermal management system for an automotive inverter includes an active discharge circuit of an automotive inverter in thermal communication with a DC link capacitor, a thermal interface material positioned between the active discharge circuit and the DC link capacitor such that heat generated from the active discharge circuit is transferred to the DC link capacitor by the thermal interface material, and a coolant channel for a cooling fluid extending between the DC link capacitor and a base plate of the automotive inverter, wherein the heat generated from the active discharge circuit of the automotive inverter is transferred from the DC link capacitor to the cooling fluid to dissipate the heat.

A thermal management assembly for an automotive inverter includes a main controller board including a passive discharge circuit, an active discharge board coupled to the main controller board, the active discharge board including an active discharge circuit, a DC link capacitor forming a metallic housing, a thermal interface material thermally connecting the active discharge board with the metallic housing, and a coolant channel for carrying heat dissipated by the passive discharge circuit and the active discharge circuit to a cooling fluid circulating within the coolant channel regulating the temperature of the automotive inverter.

A method to thermally manage heat dissipated from automotive inverter includes thermally connecting a printed circuit board including an active discharge circuit and a DC link capacitor by a thermal interface material, the DC link capacitor including a metallic housing, transferring heat dissipated from the active discharge circuit to the metallic housing via the thermal interface material, and transferring the dissipated heat from a coolant channel formed in the metallic housing to a cooling fluid flowing in the coolant channel.

This Summary is provided to introduce a selection of concepts in a simplified from that are further described below in the Detailed Description. This summary is not intended to identify key features or essential features of the claimed subject matter, nor is it intended to be used to limit the scope of the claimed subject matter.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

A typical automotive inverter, such as used for an electric vehicle, includes a main controller PCB that includes both an active discharge circuit and a passive discharge circuit. During the discharge period, when the electric charge stored in the DC link capacitor is discharging through the active and passive discharge circuitry, a lot of heat is dissipated throughout the main controller board and within a housing enclosing the automotive inverter. Thus, it can be difficult to achieve a desired thermal performance of the main controller board. In some cases, the automotive inverter will cease to function properly if there is too much heat within the housing of the automotive inverter.

Figure 1:
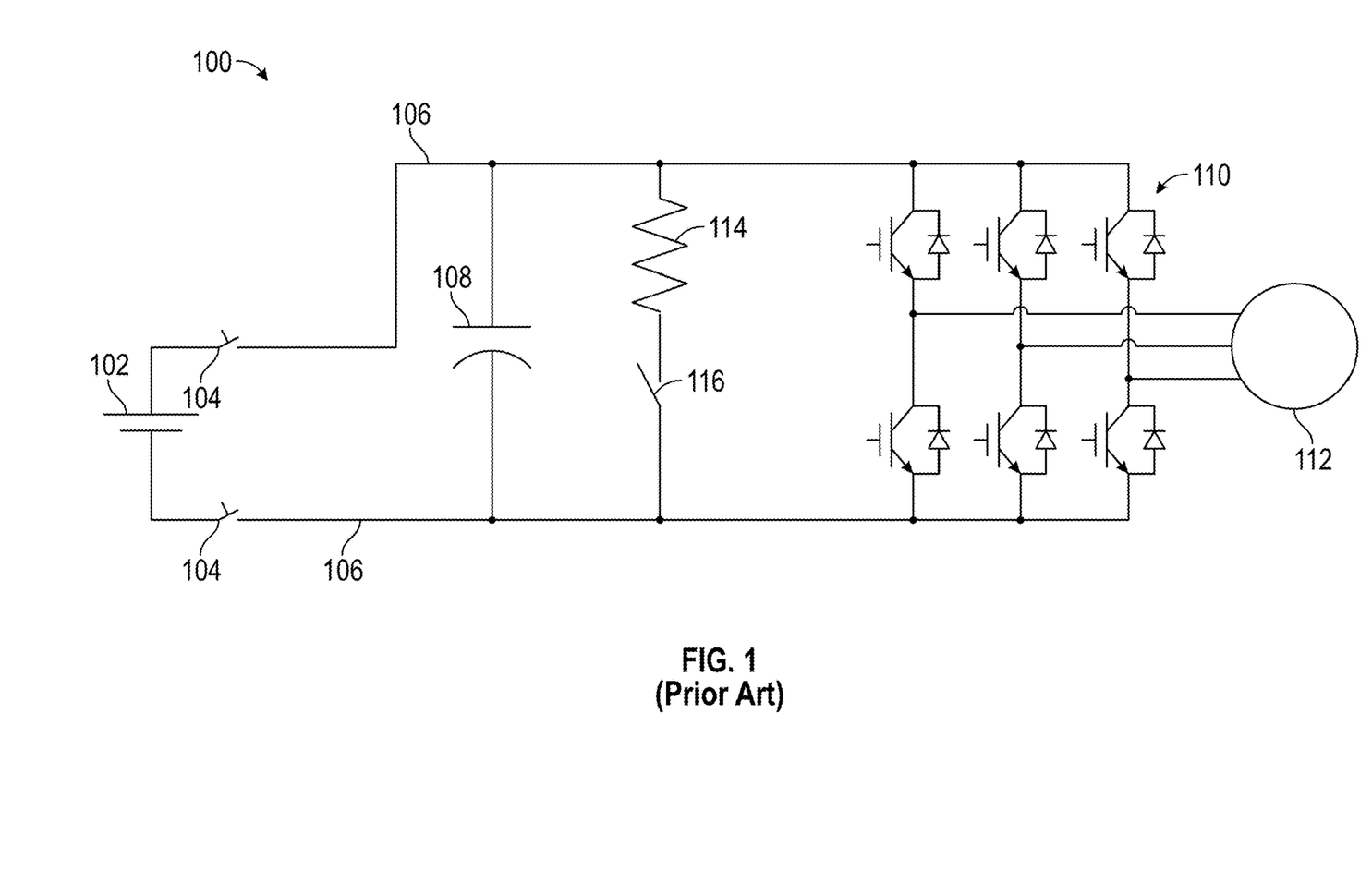
FIG. 1 illustrates a circuit diagram of a prior art embodiment of an electric vehicle.

FIG. 1 illustrates a circuit diagram of a prior art embodiment of an electric vehicle. The electric vehicle system 100 includes an HV battery 102 coupled to contactor switches 104, such as relay switches, for example, to selectively connect the HV battery 102 to a bus 106 of the electric vehicle system 100. A DC link capacitor 108 functions as a linking capacitor for an inverter 110. Inverter 110 includes a plurality of switching devices that are switched to drive motor 112. In FIG. 1, the active discharge circuit comprises discharge resistor 114 in series with active discharge switch 116. The active discharge switch 116 can selectively turn the active discharge circuit on or off. Further circuitry may be used to control the active discharge switch 116.

Figure 2:
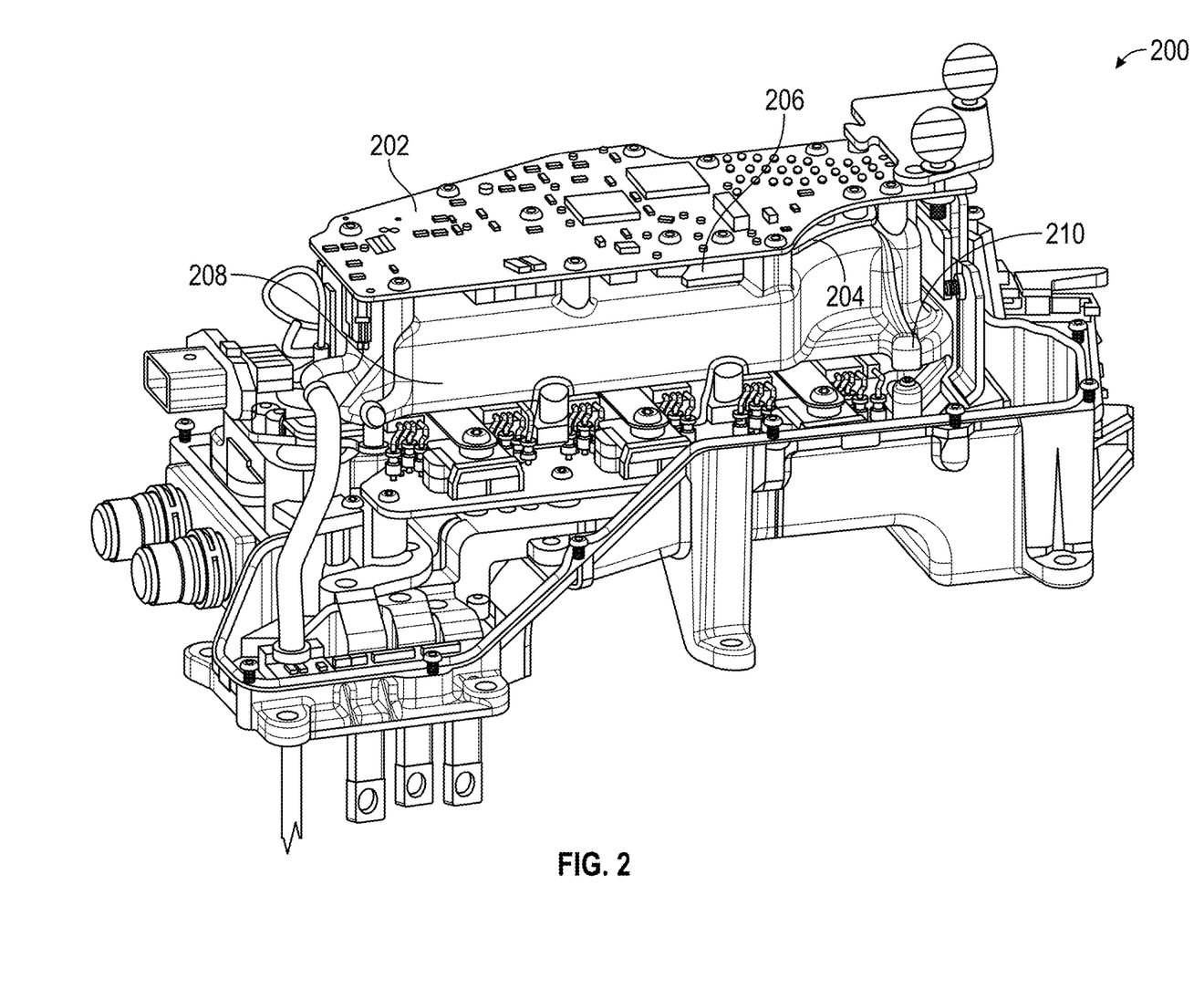
FIG. 2 illustrates a perspective view of an automotive inverter.

FIG. 2 illustrates a perspective view of an automotive inverter, such as for an electric vehicle. The automotive inverter 200 interfaces the HV battery 102 through the DC link capacitor 108. The automotive inverter 200 includes a main controller board 202, an active discharge board 204 positioned underneath, in a vertical direction with reference to FIG. 2, a thermal interface board 206 positioned adjacent to and underneath the active discharge board 204, the DC link capacitor which in FIG. 2 is represented as metallic housing 208, and an upper coolant channel 210 formed in the metallic housing 208 that cools the automotive inverter 200. The automotive inverter 200 includes a housing (not shown) that encloses the components of automotive inverter 200.

Figure 3:
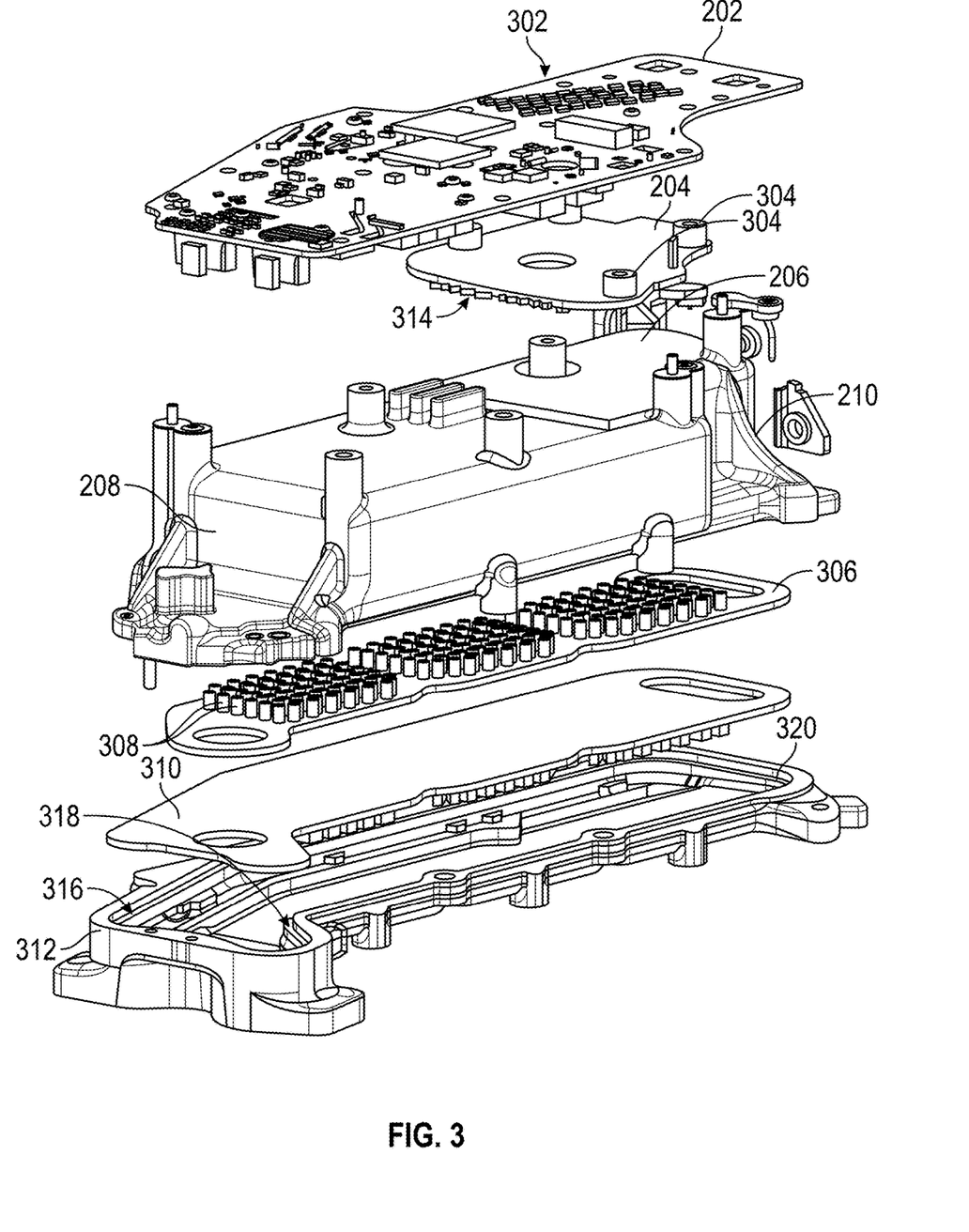
FIG. 3 illustrates an exploded view of a thermal management assembly for the automotive inverter of FIG. 2.

FIG. 3 illustrates an exploded view of a thermal management assembly for the automotive inverter of FIG. 2. The main controller board 202 includes circuitry that converts AC current into DC current and a passive discharge circuit 302. The passive discharge circuit 302 comprises electronic components including at least a high ohm resistor hard wired to the DC link capacitor 108. The passive discharge circuit 302 does not include a switch, making it a closed circuit. Because of the high resistance, it may take a minute or two for the passive discharge circuit 302 to discharge the high voltage charge to a safe level. During the discharge of the DC link capacitor 108, heat is dissipated by the passive discharge circuit 302.

Referring to FIG. 3, below the main controller board 202 is the active discharge board 204. The active discharge board 204 includes the active discharge circuit 314. The active discharge circuit 314 comprises electronic components which may include a transistor as well as a resistor. The active discharge circuit 314 allows the DC link capacitor 108 to discharge much quicker than the passive discharge circuit 302. The active discharge board 204 is coupled to the main controller board 202. The active discharge board 204 is separated from the main controller board 202 by spacing components 304 and coupled to it by metallic fasteners such as by screws. An electrical and thermal connection between the main controller board 202 and active discharge board 204 is enabled by both the metallic fasteners and a pin connection between the two boards.

A board comprising the thermal interface board 206 is positioned against the metallic housing 208. The thermal interface board 206 may comprise any suitable, commercially available thermal interface material, e.g., thermal filler material. A thermal property of the thermal interface material may be matched to the thermal requirements of the automotive inverter 200 so that the heat pulled through the thermal interface board 206 and away from the active discharge circuit 314 is adequate for the performance of the automotive inverter 200.

In the shown embodiment, the DC link capacitor is embodied as a metallic housing 208. It acts as a storage device storing an electrical charge when the contactor switches 104 are closed and the DC link capacitor 108 is connected to the HV battery 102. The metallic housing 208 is also thermally connected to active discharge board 204 and the main controller board 202 via the thermal interface board 206 so that the heat dissipated from the active discharge circuit is thermally conducted through the metallic housing 208.

The upper coolant channel 210 is formed in the metallic housing 208 where heat dissipated by the active discharge circuit 314 is pulled away by the DC link capacitor, e.g., metallic housing 208. An upper coolant plate 306 and lower coolant plate 310 are positioned below, when the automotive inverter 200 is oriented as shown in FIG. 3, the metallic housing 208 and include a plurality of pin fins 308, to allow passage of dissipated heat to a lower coolant channel 320. The upper coolant channel 210 and the lower coolant channel are in fluid communication with one another. Each pin fin 308 extends through the upper coolant plate 306 and the lower coolant plate 310 and includes an inlet in the upper coolant plate 306 and an outlet in the lower coolant plate 310. The lower coolant channel 320 is formed in a base plate 312 of the automotive inverter 200 and carries a circulating cooling fluid. The cooling fluid is circulated by a pump (not shown) from the electric vehicle system 100, the cooling fluid entering the lower coolant channel 320 from a coolant inlet 316 and exiting through a coolant outlet 318.

Figure 4:
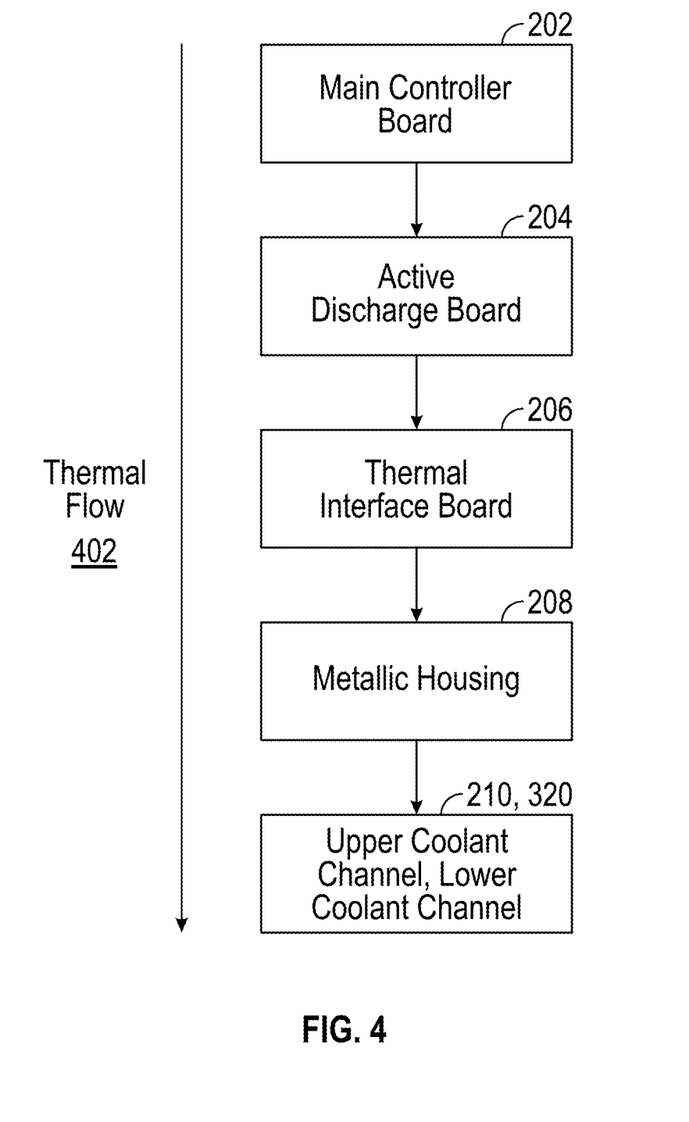
FIG. 4 illustrates a schematic diagram of the thermal flow of the automotive inverter.

FIG. 4 illustrates a schematic diagram of the thermal flow 402 of the automotive inverter 200. During the discharge of the DC link capacitor 108, heat is dissipated by the passive discharge circuit 302 on the main controller board 202. In addition, heat from the active discharge circuit 314 located on the active discharge board 206 is dissipated during a discharge of the DC link capacitor 108. During this discharge period, however, the active discharge circuit 314 dissipates a considerable amount of heat, more than the passive discharge circuit 302. The heat from both the active discharge circuit 314 and the passive discharge circuit 302 flows through the thermal interface board 206 to the metallic housing 208 of the DC link capacitor. The dissipated heat is thermally conducted through the metallic housing 208 to the upper coolant channel 210 formed in the metallic housing 208. This thermal conduction functionality of the metallic housing 208 will not affect the temperature of the DC link capacitor 108. The thermal flow of dissipated heat then flows through the plurality of pin fins 308 in the upper coolant plate 306 and the lower coolant plate 310 to the base plate 312. At the base plate 312, the heat is transferred to a cooling fluid flowing within the lower coolant channel 320 thereby allowing regulation of the automotive inverter 200 temperature.

Figure 5A:
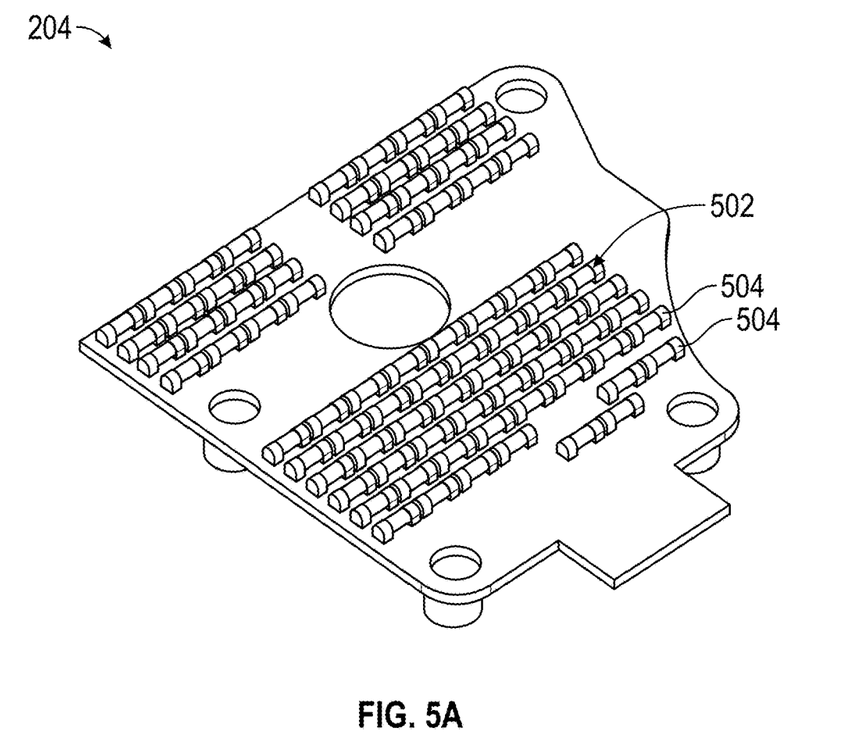
FIG. 5A illustrates a perspective view of the active discharge board.
Figure 5B:
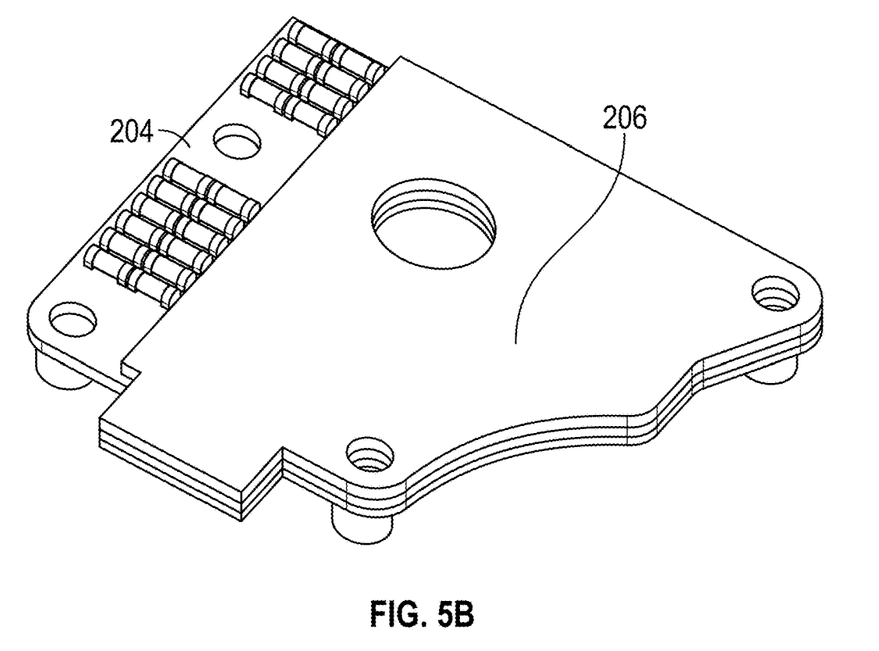
FIG. 5B illustrates a perspective view of the active discharge board coupled to the thermal interface board.

FIG. 5A illustrates a perspective view of the active discharge board 204. An active discharge circuit 502 is formed on the active discharge board 204 and comprises at least one array of resistors 504. FIG. 5B illustrates a perspective view of the active discharge board coupled to the thermal interface board 206. As shown in FIG. 5B, the thermal interface board 206 is positioned to contact the thermal interface board 206. Thus, the arrays of resistors 504 are connected to the metallic housing 208 of the DC link capacitor via the thermal interface board 206.

FIG. 5B illustrates a graph depicting a thermal analysis of the active discharge board 204 in an operation of the automotive inverter 200. The first line 702 depicts the temperature of the active discharge board 204 without using a thermal interface board 206 and active cooling. The maximum temperature of a resistor component of the arrays of resistors 504 on the active discharge board 204 is 187 degrees C. after a second heating cycle. The second line 704 depicts the temperature of the active discharge board 204 using the thermal interface board 206 positioned between the active discharge board 204 and the metallic housing 208 and active cooling utilizing the upper coolant channel 210. The maximum temperature of a resistor component in the arrays of resistors 504 on the active discharge board 204 is 147 degrees C. after a second heating cycle. The duty cycle for the resistor component was not more than 110 seconds.

Figure 6:
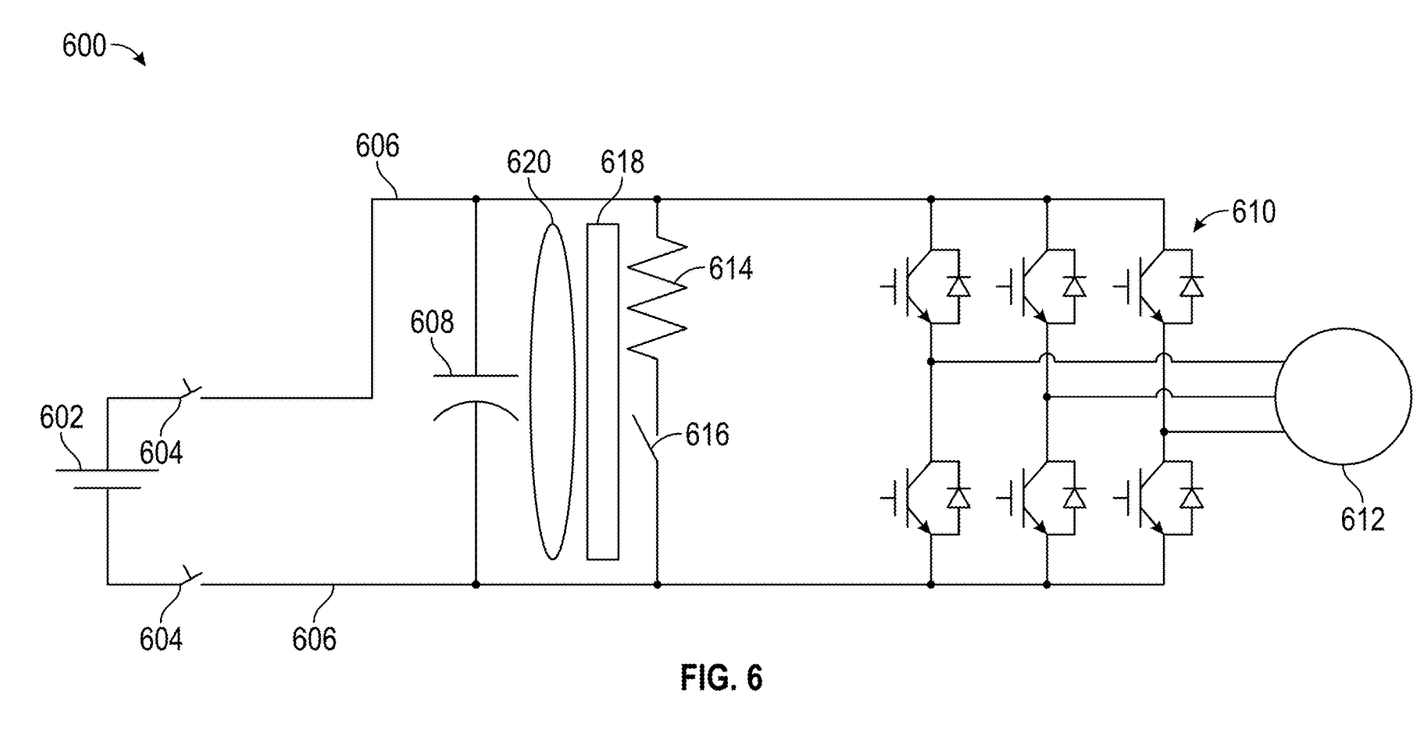
FIG. 6 illustrates a circuit diagram of an embodiment of an electric vehicle.

FIG. 6 illustrates a circuit diagram of an electric vehicle system 600. The electric vehicle system 600 includes an HV battery 602 coupled to contactor switches 604, such as relay switches, for example, to selectively connect the HV battery 602 to a bus 606 of the electric vehicle system 600. A DC link capacitor 608 functions as a linking capacitor for an inverter 610. Inverter 610 includes a plurality of switching devices that are switched to drive motor 612. The active discharge circuit comprises discharge resistor 614 in series with active discharge switch 616. The active discharge switch 616 can selectively turn the active discharge circuit on or off. Further circuitry may be used to control the active discharge switch 616. The electric vehicle system 600 is similar to electric vehicle system 100 shown in FIG. 1, but schematically shows a position of the coolant channel 620 and the thermal interface board 618 to illustrate their position within the circuitry of the electric vehicle system 100.

Figure 7:
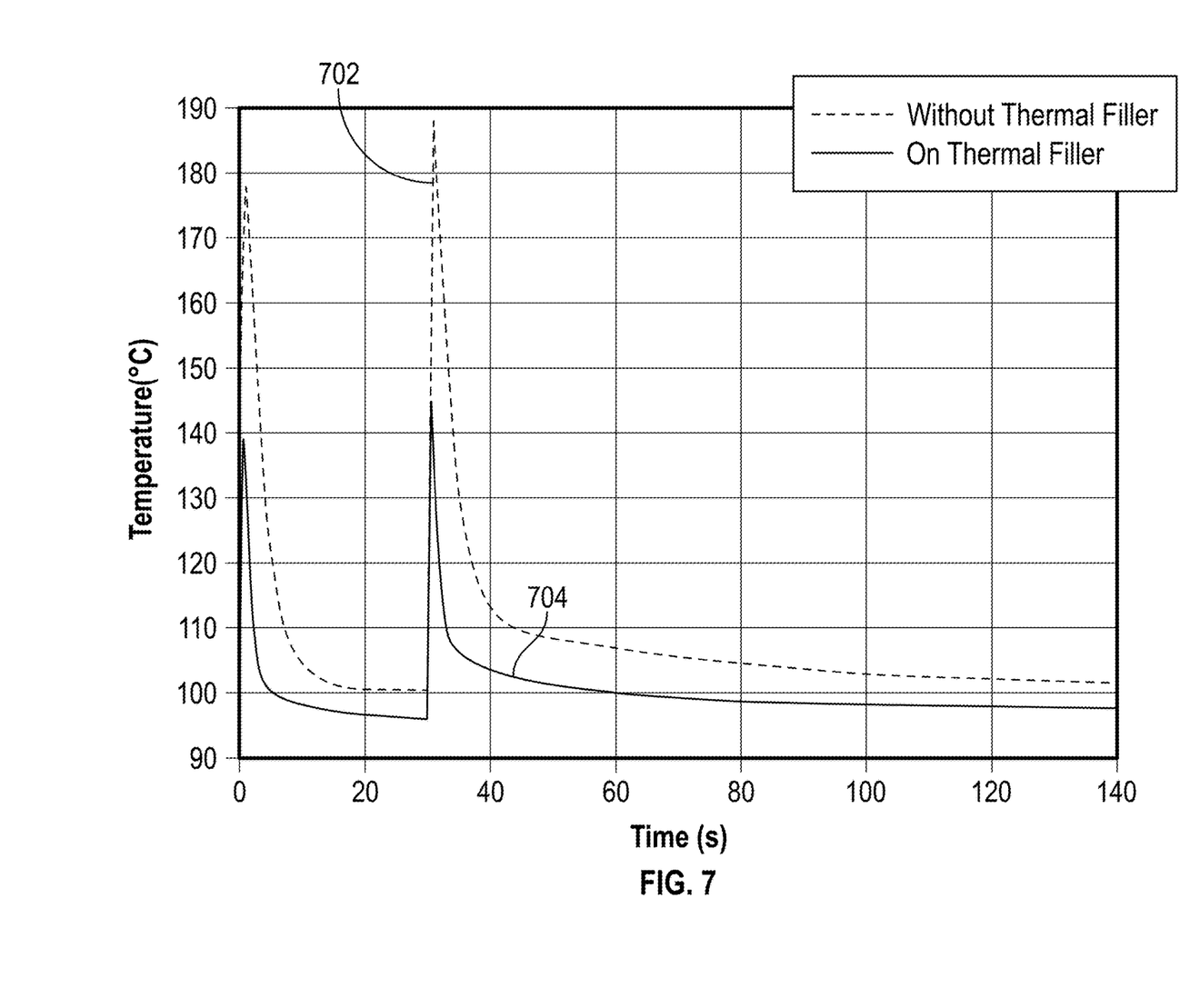
FIG. 7 illustrates graph depicting a transient thermal analysis with and without the thermal interface material.

FIG. 7 illustrates a graph depicting a transient thermal analysis of the active discharge board 204 with and without the thermal interface material in an operation of the automotive inverter 200. The first line 702 depicts the temperature of the active discharge board 204 without using a thermal interface board 206 and active cooling. The maximum temperature of a resistor component of the arrays of resistors 504 on the active discharge board 204 is 187° C. after a second heating cycle. The second line 704 depicts the temperature of the active discharge board 204 using the thermal interface board 206 positioned between the active discharge board 204 and the metallic housing 208 and active cooling utilizing the upper coolant channel 210. The maximum temperature of a resistor component in the arrays of resistors 504 on the active discharge board 204 is 147° C. after a second heating cycle. The duty cycle for the resistor component was not more than 110 seconds.

By introducing the active discharge circuit on a separate active discharge board, the presented thermal management system saves space on the main controller board as well as improves the thermal performance of the active discharge functionality. For example, the heat generated during the active discharge function of the active discharge circuit is transferred to the existing metallic housing of the DC link capacitor through a thermal interface material which is connected to a coolant channel to dissipate the generated heat. Using the existing DC link capacitor, e.g., metallic housing 208, as a heat sink mechanism, removes the need to add an external heat sink component to the automotive inverter and ultimately regulates the temperature of the automotive inverter.

What is claimed is:

1. A thermal management system, the system comprising:
   an active discharge circuit of an automotive inverter in thermal communication with a DC link capacitor;
   a thermal interface material positioned between the active discharge circuit and the DC link capacitor such that heat generated from the active discharge circuit is transferred to the DC link capacitor by the thermal interface material; and
   a coolant channel for a cooling fluid extending between the DC link capacitor and a base plate of the automotive inverter, wherein the heat generated from the active discharge circuit of the automotive inverter is transferred from the DC link capacitor to the cooling fluid to dissipate the heat.

2. The thermal management system of claim 1, wherein the active discharge circuit is formed on a printed circuit board separate from a main controller board that includes a passive discharge circuit.

3. The thermal management system of claim 1, wherein the active discharge circuit comprises an array of resistors that is in contact with the thermal interface material.

4. The thermal management system of claim 1, wherein a thermal property of the thermal interface material matches the thermal requirements of the automotive inverter.

5. The thermal management system of claim 1, wherein the DC link capacitor forms a metallic housing providing a heat sink for the heat generated from the active discharge circuit.

6. A thermal management assembly for an automotive inverter, comprising:
   a main controller board including a passive discharge circuit;
   an active discharge board coupled to the main controller board, the active discharge board including an active discharge circuit;
   a DC link capacitor forming a metallic housing;
   a thermal interface material thermally connecting the active discharge board with the metallic housing; and
   a coolant channel for carrying heat dissipated by the passive discharge circuit and the active discharge circuit to a cooling fluid circulating within the coolant channel regulating a temperature of the automotive inverter.

7. The thermal management assembly of claim 6,
   wherein an upper coolant channel is formed in the metallic housing of the DC link capacitor and a lower coolant channel is formed in a base plate of the automotive inverter, and
   wherein the cooling fluid circulates within the lower coolant channel.

8. The thermal management assembly of claim 6, wherein the active discharge board includes an array of resistors in contact with the thermal interface material.

9. The thermal management assembly of claim 6, wherein the active discharge board is positioned adjacent to the main controller board.

10. A method to thermally manage heat dissipated from automotive inverter, comprising:
    thermally connecting a printed circuit board including an active discharge circuit and a DC link capacitor by a thermal interface material, the DC link capacitor forming a metallic housing;
    transferring heat dissipated from the active discharge circuit to the metallic housing via the thermal interface material; and
    transferring the dissipated heat from a coolant channel formed in the metallic housing to a cooling fluid flowing in the coolant channel.

11. The method of claim 9, wherein the metallic housing provides a heat sink for the heat generated from the active discharge circuit.

* * * * *